United States Patent
Ozai

(10) Patent No.: US 7,915,362 B2
(45) Date of Patent: Mar. 29, 2011

(54) HEAT-CURABLE SILICONE COMPOSITION AND LIGHT EMITTING DIODE ELEMENT USING SAME

(75) Inventor: Toshiyuki Ozai, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 662 days.

(21) Appl. No.: 11/859,123

(22) Filed: Sep. 21, 2007

(65) Prior Publication Data

US 2008/0076882 A1    Mar. 27, 2008

(30) Foreign Application Priority Data

Sep. 22, 2006 (JP) .................... 2006-256581

(51) Int. Cl.
*C08G 77/20* (2006.01)
(52) U.S. Cl. .......................... 526/279; 528/39
(58) Field of Classification Search ............. 526/279; 528/39

See application file for complete search history.

(56) References Cited

U.S. PATENT DOCUMENTS

| | | | |
|---|---|---|---|
| 4,201,808 A | 5/1980 | Cully et al. | |
| 4,525,563 A | 6/1985 | Shibata et al. | |
| 4,733,942 A | 3/1988 | Hida et al. | |
| 4,886,841 A | 12/1989 | Hida et al. | |
| 4,943,613 A | 7/1990 | Arai et al. | |
| 5,965,299 A * | 10/1999 | Khan et al. | 429/313 |
| 2005/0129957 A1 | 6/2005 | Kashiwagi et al. | |
| 2006/0270788 A1 | 11/2006 | Ozai et al. | |

FOREIGN PATENT DOCUMENTS

| | | |
|---|---|---|
| EP | 0 134 678 | 3/1985 |
| EP | 0 378 370 | 7/1990 |
| EP | 1 045 009 | 10/2000 |
| GB | 2137635 | 10/1984 |
| JP | 58-173174 | 10/1983 |
| JP | 62-119141 | 5/1987 |
| JP | 63-186719 | 8/1988 |
| JP | 1-304108 | 12/1989 |
| JP | 3-166262 | 7/1991 |
| JP | 10-228249 | 8/1998 |
| JP | 10-242513 | 9/1998 |
| JP | 11-1619 | 1/1999 |
| JP | 2000-123981 | 4/2000 |
| JP | 2001123120 | 5/2001 |
| JP | 2007-214543 | 8/2007 |
| JP | 2007-314758 | 12/2007 |

OTHER PUBLICATIONS

Anonymous, Database IP. Com IPCOM000134301D, Mar. 1, 2006, "Härtbare Siliconmassen für Licht emittierende Dioden (LED)", XP-002473018.
U.S. Appl. No. 11/763,782, filed Jun. 15, 2007, Matsumoto et al.
Office Action issued Nov. 9, 2010, in Chinese Patent Application No. 200710154338.2, filed Sep. 21, 2007, with English Translation.

* cited by examiner

*Primary Examiner* — Kuo-Liang Peng
(74) *Attorney, Agent, or Firm* — Oblon, Spivak, McClelland, Maier & Neustadt, L.L.P.

(57) ABSTRACT

Provided is a heat-curable silicone composition containing: (A) an organopolysiloxane having at least one structure represented by the following general formula (2) within each molecule:

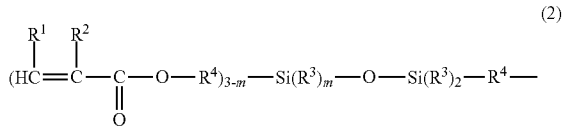

wherein m represents an integer of 0, 1 or 2, $R^1$ represents a hydrogen atom, a phenyl group or a halogenated phenyl group, $R^2$ represents a hydrogen atom or a methyl group, $R^3$ represents an identical or different monovalent organic group having 1 to 10 carbon atoms, and $R^4$ represents an identical or different bivalent organic group having 1 to 10 carbon atoms; and (B) a quantity of an organic peroxide that is effective as a curing catalyst. The heat-curable silicon composition yields a cured product having excellent transparency and minimal discoloration over time. Also provided is a light emitting diode element having a material composed of the cured product.

8 Claims, No Drawings

HEAT-CURABLE SILICONE COMPOSITION AND LIGHT EMITTING DIODE ELEMENT USING SAME

BACKGROUND OF THE INVENTION

1. Field of the Invention

The present invention relates to a heat-curable silicone composition, and to a light emitting diode element in which the composition is used as a protective or adhesive material, as a material for altering or adjusting the wavelength, or as a lens material.

2. Description of the Prior Art

Conventionally, epoxy resins have generally been used as the sealing materials for light emitting diode elements. The use of silicone resins as materials within light emitting diode elements has also been disclosed in patent reference 1 and patent reference 2, which disclose trials using a silicone resin as a lens material, and in patent reference 3, which discloses a trial using a silicone resin as a wavelength-altering coating, but examples of the actual use of silicone resins are few.

On the other hand, with white LEDs now attracting considerable attention, problems have emerged for epoxy resin-based sealing materials, including yellowing caused by exposure to ultraviolet light or the like during actual use of the LED, and an increased propensity to cracking caused by the increase in the heating value that accompanies miniaturization. Resolving these problems has become an urgent issue. Furthermore, the above compositions include compositions in which curing proceeds via an addition reaction in the presence of a platinum catalyst, but curing-inhibiting substances within the LED can cause unsatisfactory curing of the composition.

[Patent Reference 1] JP 10-228249 A
[Patent Reference 2] JP 10-242513 A
[Patent Reference 3] JP 2000-123981 A
[Patent Reference 4] JP 11-1619 A

SUMMARY OF THE INVENTION

The present invention takes the above circumstances into consideration, with an object of providing a heat-curable silicone resin composition that yields a cured product with excellent transparency and minimal discoloration over time, and also providing a light emitting diode element that uses this composition.

As a result of intensive investigation, the inventors of the present invention discovered that the above object could be achieved by using a specific heat-curable silicone resin composition.

In other words, the present invention provides a heat-curable silicone composition comprising:

(A) an organopolysiloxane having at least one structure represented by a general formula (1) within each molecule:

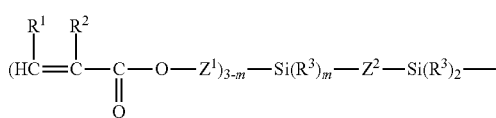

(wherein, m represents an integer of 0, 1 or 2, $R^1$ represents a hydrogen atom, phenyl group or halogenated phenyl group, $R^2$ represents a hydrogen atom or methyl group, $R^3$ represents identical or different monovalent organic groups of 1 to 10 carbon atoms, $Z^1$ represents a bivalent group represented by —$R^4$—, —$R^4O$— or —$R^4(CH_3)_2SiO$— (wherein, $R^4$ represents identical or different bivalent organic groups of 1 to 10 carbon atoms), and $Z^2$ represents an oxygen atom or identical or different bivalent organic groups of 1 to 10 carbon atoms), and (B) a quantity of an organic peroxide that is effective as a curing catalyst.

Furthermore, the present invention also provides a light emitting diode element having a member comprising a cured product of the above heat-curable silicone composition.

In other words, upon curing, the above composition yields a transparent cured product that exhibits excellent heat resistance and discoloration resistance. Accordingly, this composition is ideal for use within light emitting diode elements, and is useful as a material for protecting (sealing) or bonding of the element, as a material for altering or adjusting the wavelength emitted by the element, and as a lens material for the element.

DETAILED DESCRIPTION OF THE PREFERRED EMBODIMENTS

As follows is a more detailed description of the present invention. In the following description, polystyrene equivalent weight average molecular weights refer to values measured using gel permeation chromatography.

[Heat-Curable Silicone Composition]

A sequential description of the heat-curable silicone composition according to the present invention is presented below.

—Component (A)—

The component (A) uses an organopolysiloxane having at least one structure represented by the general formula (1) within each molecule:

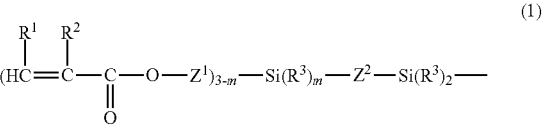

(wherein, m represents an integer of 0, 1 or 2, $R^1$ represents a hydrogen atom, phenyl group or halogenated phenyl group, $R^2$ represents a hydrogen atom or methyl group, $R^3$ represents identical or different monovalent organic groups of 1 to 10 carbon atoms, $Z^1$ represents a bivalent group represented by —$R^4$—, —$R^4O$— or —$R^4(CH_3)_2SiO$— (wherein, $R^4$ represents identical or different bivalent organic groups of 1 to 10 carbon atoms), and $Z^2$ represents an oxygen atom or identical or different bivalent organic groups of 1 to 10 carbon atoms).

In the general formula (1), the monovalent organic groups of 1 to 10 carbon atoms represented by $R^3$ are typically groups of 1 to 10, and preferably from 1 to 8, carbon atoms, and specific examples of suitable groups include hydrocarbon groups including alkyl groups such as a methyl group, ethyl group, propyl group, isopropyl group, butyl group, isobutyl group, tert-butyl group, pentyl group, neopentyl group, hexyl group, cyclohexyl group, octyl group, nonyl group, or decyl group; aryl groups such as a phenyl group, tolyl group, xylyl group, or naphthyl group; aralkyl groups such as a benzyl group, phenylethyl group, or phenylpropyl group; and alkenyl groups such as a vinyl group, allyl group, propenyl group, isopropenyl group, butenyl group, hexenyl group, cyclohexenyl group, or octenyl group; as well as substituted hydrocarbon groups in which a portion of, or all of, the hydrogen atoms within an aforementioned hydrocarbon group have been substituted with a halogen atom such as fluorine, bromine or chlorine atom, or a cyano group or the like, including halogenated alkyl groups such as a chloromethyl group, chloropropyl group, bromoethyl group or trifluoropropyl group, or a cyanoethyl group; and groups in which an ether linkage (an etheric oxygen atom) or an amide linkage is incorporated within a portion of the hydrocarbon chain in one of the above substituted or unsubstituted hydrocarbon groups.

Examples of the bivalent organic group of 1 to 10 carbon atoms represented by $R^4$ or $Z^2$ include bivalent substituted or unsubstituted hydrocarbon groups, including alkylene groups such as a methylene group, ethylene group or trimethylene group, and furthermore, either a portion of, or all of, the hydrogen atoms of these hydrocarbon groups may be substituted with a halogen atom such as fluorine, bromine or chlorine atom, or a cyano group or the like. Moreover, an ether linkage or amide linkage may also be incorporated within the hydrocarbon chain of these groups.

In the above general formula (1), when $Z^1$ represents a bivalent organic group represented by —$R^4$—, $Z^2$ is preferably an oxygen atom, and when $Z^1$ represents a bivalent group represented by —$R^4O$— or —$R^4(CH_3)_2SiO$—, $Z^2$ preferably represents identical or different bivalent organic groups of 1 to 10 carbon atoms.

In a preferred embodiment, the structure represented by the above general formula (1) exists in a structure represented by a general formula (2) shown below as a portion thereof:

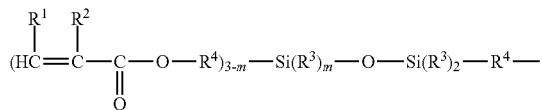

(2)

(wherein, m, $R^1$, $R^2$, $R^3$ and $R^4$ are as defined above in relation to the general formula (1)). Specific examples of the structure of this general formula (2) include the structures shown below.

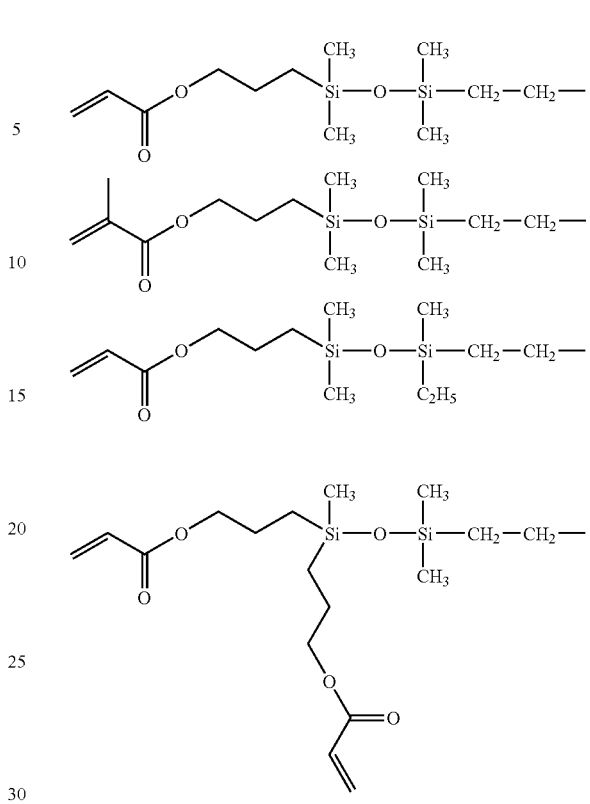

The organopolysiloxane of the component (A) preferably comprises an average of at least 0.1 mol %, and even more preferably from 1 to 50 mol %, of $SiO_2$ units relative to the combined total of all the siloxane units that exist within the molecule of the component (A).

Examples of the organopolysiloxane of the component (A) are shown below.

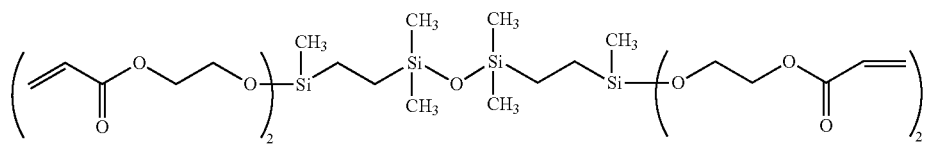

(a-1)

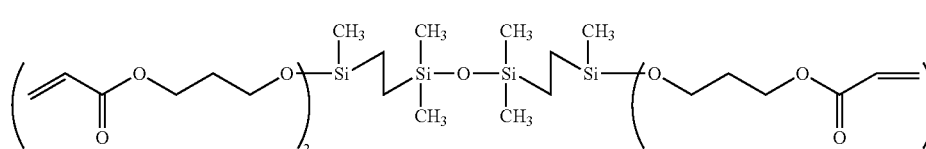

(a-2)

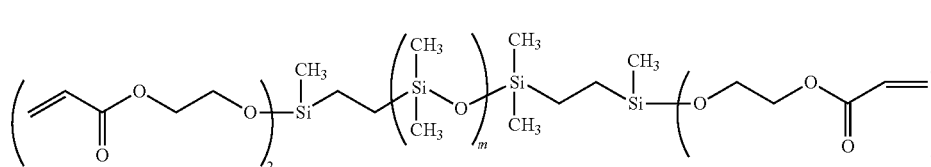

(a-3)

(wherein, m represents an integer from 2 to 150)

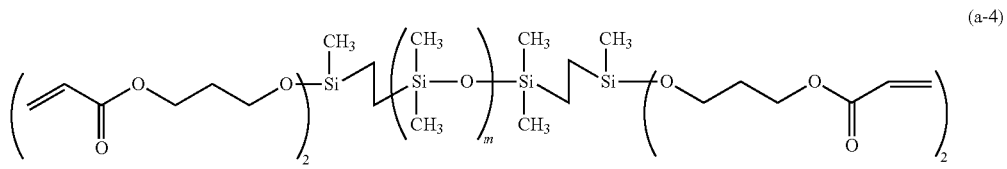
(a-4)

(wherein, m represents an integer from 2 to 150)

(a-5)

An organopolysiloxane with a polystyrene equivalent weight average molecular weight of 5,000, comprising the MA unit, M unit and Q unit shown below, wherein the molar ratio between these units is MA:M:Q=1:4:6.

—MA Unit

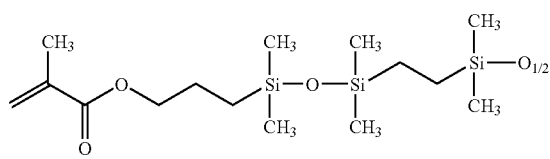

—M Unit

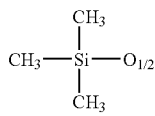

—Q Unit
$SiO_{4/2}$ (a-6)

An organopolysiloxane with a polystyrene equivalent weight average molecular weight of 3,500, comprising the MA-D unit, D unit and T unit shown below, wherein the molar ratio between these units is MA-D:D:T=2:6:7.

—MA-D Unit

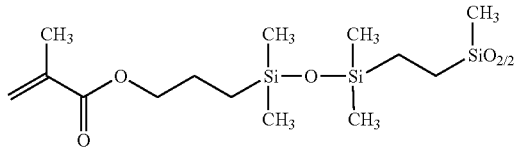

—D Unit
$(CH_3)_2SiO_{2/2}$
—T Unit
$CH_3—SiO_{3/2}$

These organopolysiloxanes of the component (A) may be used either alone, or in combinations of two or more different compounds.

—Component (B)—

The organic peroxide of the component (B) functions as a curing agent (a catalyst), and cures the silicone composition of the present invention to form a silicone rubber or resin.

Examples of suitable organic peroxides include benzoyl peroxide, t-butyl perbenzoate, o-methylbenzoyl peroxide, p-methylbenzoyl peroxide, di-t-butyl peroxide, dicumyl peroxide, 1,1-bis(t-butylperoxy)-3,3,5-trimethylcyclohexane, 1,1-di(t-butylperoxy)cyclohexane, 2,5-dimethyl-2,5-di(t-butylperoxy)hexane, 2,5-dimethyl-2,5-di(t-butylperoxy)hexyne, 1,6-bis(p-toluoylperoxycarbonyloxy)hexane, and di(4—methylbenzoylperoxy)hexamethylene biscarbonate. These compounds may be used either alone, or in combinations of two or more different compounds.

The quantity added of the component (B) need only be sufficient to be effective as a catalyst. Typically, a quantity within a range from 0.01 to 5 parts by mass per 100 parts by mass of the organopolysiloxane of the component (A) is preferred, and quantities from 0.05 to 3 parts by mass are particularly desirable.

—Other Components—

If necessary, other components may also be added to the composition of the present invention, provided such addition does not impair the objectives or effects of the present invention.

—Reactive Diluents

Reactive diluents containing silicone or reactive diluents containing no silicone may be added for purposes such as adjusting the viscosity of the composition or the hardness of the cured product.

Examples of reactive diluents containing silicone include organopolysiloxanes exemplified by the chemical formulas shown below. These compounds may be used either alone, or in combinations of two or more different compounds.

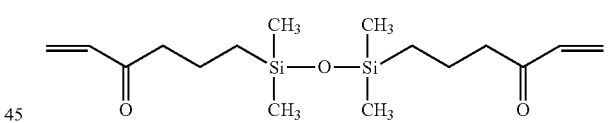

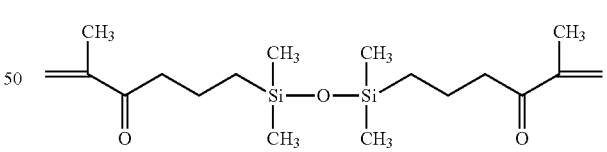

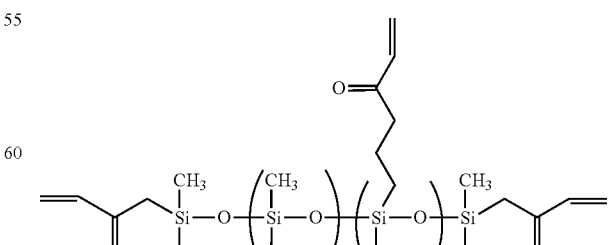

(wherein, l=18 and m=180)

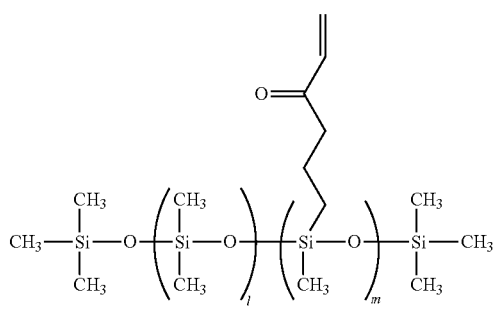

(wherein, l=20 and m=180)

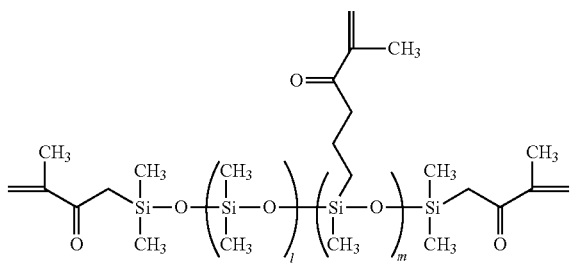

(wherein, l=18 and m=180)

Examples of reactive diluents containing no silicone include (meth)acrylates such as those represented by a formula: $H_2C=CGCO_2R^5$, wherein G represents a hydrogen, halogen, or alkyl group of 1 to approximately 4 carbon atoms; and $R^5$ represents a group selected from amongst alkyl, cycloalkyl, alkenyl, cycloalkenyl, alkaryl, aralkyl and aryl groups of 1 to approximately 16 carbon atoms, and if necessary, any of these groups may also be substituted or terminated with a silane, silicon, oxygen, halogen, carbonyl, hydroxyl, ester, carboxylic acid, urea, urethane, carbamate, amine, amide, sulfur, sulfonate, sulfone or the like.

Specific examples of particularly desirable (meth)acrylates for use as reactive diluents include polyethylene glycol di(meth)acrylate, bisphenol-A di(meth)acrylates such as ethoxylated bisphenol—A (meth)acrylate ("EBIPA" or "EBIPMA"), tetrahydrofuran (meth)acrylate and di(meth) acrylate, citronellyl acrylate and citronellyl methacrylate, hydroxypropyl (meth)acrylate, hexanediol di(meth)acrylate ("HDDA" or "HDDMA"), trimethylolpropane tri(meth) acrylate, tetrahydrodicyclopentadienyl (meth)acrylate, ethoxylated trimethylolpropane triacrylate ("ETTA"), triethylene glycol diacrylate and triethylene glycol dimethacrylate ("TRIEGMA"), isobornyl acrylate and isobornyl methacrylate.

Combinations of two or more of these (meth)acrylates may, of course, also be used as the reactive diluent.

The above reactive diluent is an optional component that may be added as required, and the blend quantity is typically not more than approximately 30 parts by mass (namely, from 0 to approximately 30 parts by mass) per 100 parts by mass of the component (A). In those cases where a reactive diluent is used, the blend quantity is typically within a range from about 0.01 to about 30 parts by mass, and preferably from 0.05 to 10 parts by mass, per 100 parts by mass of the component (A).

—Modifiers

The composition of the present invention may also include other components for modifying the cured properties or uncured properties in accordance with the requirements of specific applications. For example, adhesion promoters such as (meth)acryloxypropyltrimethoxysilane, trialkyl or triallyl isocyanurates, glycidoxypropyltrimethoxysilane and vinyltrimethoxysilane may be added in quantities of up to approximately 20% by mass of the composition.

Furthermore, non-(meth)acrylic silicone diluents or plasticizers may be added in quantities of up to approximately 30% by mass of the composition. Examples of such non-(meth)acrylic silicones include trimethylsilyl-terminated oils having a viscosity at 25° C. within a range from 100 to 500 mPa·s, and silicone rubbers. These non-(meth)acrylic silicones may also include copolymerizable groups such as vinyl groups.

—Inorganic Fillers

Inorganic fillers may also be added to the composition in quantities that do not impair the targeted transparency. These fillers may be reinforcing silica products such as fumed silica, and these silica products may be either untreated (hydrophilic), or in a treated hydrophobic form. Any reinforcing fumed silica can be used.

—Antioxidants

The composition may also include antioxidants such as butylhydroxytoluene or p—methoxyphenol in order to ensure better retention of the transparency.

—Preparation and Curing—

The present invention also provides a method of preparing the composition, and this method comprises the step of mixing the components described above together. The composition of the present invention can usually be cured by heating at a temperature within a range from 80 to 200° C., and preferably from 100 to 180° C.

The physical properties of a cured product obtained from the composition of the present invention vary depending on the molecular weight of the reactive silicone of the general formula (1) and the curing method used. Generally, larger molecular weights for the reactive silicone yield softer curing reaction products.

[Light Emitting Diode Element]

A light emitting diode element of the present invention includes a member comprising a cured product of the above heat-curable silicone composition, wherein this member either functions as a coating or sealing body for protecting (sealing) or bonding the element, or altering or adjusting the wavelength of the emitted light, or functions as a lens material. The composition of the present invention is a low-viscosity liquid with a viscosity that is typically within a range from 3,000 to 8,000 mPa·s, and preferably from 4,000 to 6,000 mPa·s, and also exhibits favorable thixotropic properties, meaning it can be used within a typical potting process. Accordingly, when the composition of the present invention is used for the applications described above, it can simply be injected into the region requiring sealing or coating, and subsequently cured.

EXAMPLES

As follows is a more detailed description of the present invention that presents a series of examples and comparative examples of the present invention, although the present invention is in no way limited by the examples presented below.

Examples 1 to 3

The component (A) and component (B) shown below were prepared, and silicone compositions were then prepared with the blend quantities shown in Table 1. Each of the thus obtained compositions was molded into a sheet, which was then cured by heating at 150° C. for 4 hours, thus generating a cured sheet with a thickness of 2 mm. The hardness and transparency of the thus obtained cured products were evaluated using the methods described below. The results are shown in Table 2.

Hardness: the hardness was measured in accordance with the prescription of JIS 6249, using a type A durometer, manufactured by Shimadzu Corporation.

Light Transmittance: the light transmittance of a sample of the produced cured product was measured at a wavelength of 400 nm using a spectrophotometer (U-3310, manufactured by Hitachi, Ltd.), and the result was recorded as the initial light transmittance value. Subsequently, the sample was placed in a dryer at 150° C and treated in an exposed state for 500 hours, and the light transmittance was then re-measured.

[Component (A)]
(A-1)

An organopolysiloxane with a polystyrene equivalent weight average molecular weight of 5,000, comprising the MA unit, M unit and Q unit described below, wherein the molar ratio between these units is MA:M:Q=1:4:6.

—MA Unit

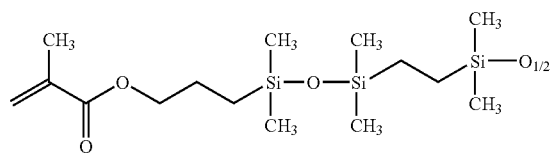

—M Unit
$(CH_3)_3SiO_{1/2}$
—Q Unit
$SiO_{4/2}$ (A-2)

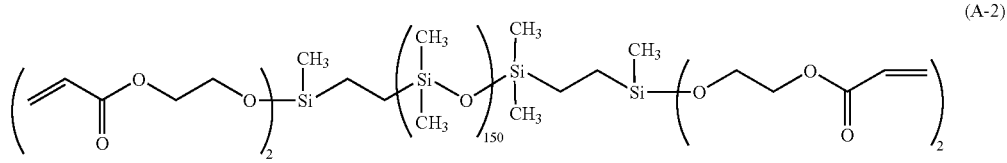

(A-3)

An organopolysiloxane with a polystyrene equivalent weight average molecular weight of 3,500, comprising the MA-D unit, D unit and T unit described below, wherein the molar ratio between these units is MA-D:D:T=2:6:7.

—MA-D Unit

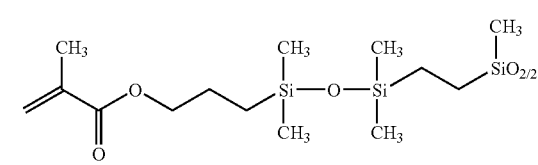

—D Unit
$(CH_3)_2SiO_{2/2}$
—T Unit
$CH_3—SiO_{3/2}$

[Component (B)]
(B) 1,1-di(t-butylperoxy)cyclohexane (product name: Perhexa C, manufactured by NOF Corporation)

TABLE 1

|       | Example 1 | Example 2 | Example 3 |
|-------|-----------|-----------|-----------|
| (A-1) | 80        | 70        |           |
| (A-2) | 20        | 30        | 40        |
| (A-3) |           |           | 60        |
| (B)   | 1         | 1         | 1         |

Comparative Example 1

To a mixture containing 100 parts by mass of an organopolysiloxane resin copolymer (a silicone resin) comprising $(C_6H_5)SiO_{3/2}$ units, $(CH_2=CH)(CH_3)SiO_{2/2}$ units and $(CH_3)_2SiO_{2/2}$ units, and with an average composition represented by a formula: $(CH_3)_{0.65}(C_6H_5)_{0.55}(CH_2=CH)_{0.25}SiO_{1.28}$, 20 parts by mass of a phenylmethylhydrogensiloxane containing 20 mol % of phenyl groups relative to the combined total of silicon atom-bonded methyl groups, phenyl groups and hydrogen atoms (SiH groups), and with a hydrogen gas yield of 150 ml/g and a viscosity at 25° C of 10 mPa·s, and 0.2 parts by mass of ethynylcyclohexanol, was added sufficient quantity of a platinum catalyst to provide 20 ppm of platinum atoms, thus completing preparation of a composition. This composition was poured into a mold prepared using glass plates, in sufficient quantity to generate a thickness of 3 mm, and was then cured by heating at 120° C for 30 minutes. The resulting cured product was removed from the mold and then post-cured for 2 hours in a 180° C. dryer, thus yielding a sample.

Comparative Example 2

To 100 parts by mass of an organopolysiloxane resin copolymer (a silicone resin) comprising $(C_6H_5)SiO_{3/2}$ units, $(CH_2=CH)(CH_3)SiO_{2/2}$ units and $(CH_3)_2SiO_{2/2}$ units, and with an average composition represented by a formula: $(CH_3)_{0.65}(C_6H_5)_{0.55}(CH_2=CH)_{0.25}SiO_{1.28}$, were added 20 parts by mass of a phenylmethylhydrogensiloxane containing 20 mol % of phenyl groups relative to the combined total of silicon atom-bonded methyl groups, phenyl groups and hydrogen atoms (SiH groups), and with a hydrogen gas yield of 150 ml/g and a viscosity at 25° C. of 10 mPa·s, 10 parts by mass of a phenylmethylhydrogensiloxane containing 10 mol % of phenyl groups relative to the combined total of silicon atom-bonded methyl groups, phenyl groups and hydrogen atoms (SiH groups), and with a hydrogen gas yield of 120 ml/g and a viscosity at 25° C. of 20 mPa·s, 0.2 parts by mass of ethynylcyclohexanol, and sufficient quantity of a platinum catalyst to provide 20 ppm of platinum atoms, thus completing preparation of a composition. This composition was poured into a similar mold to that used in the comparative example 1, and was then cured by heating at 120° C. for 30 minutes. The resulting cured product was removed from the mold and then post-cured for 2 hours in a 180° C. dryer, thus yielding a sample.

Comparative Example 3

A transparent epoxy material widely used within bullet-type LEDs was obtained, and this material was poured into a mold in the same manner as the example 1 and subsequently cured by heating at 150° C. for 8 hours, thus yielding a sample.

The cured products obtained in the comparative examples 1 to 3 were measured for hardness and light transmittance (an initial value and a value following heat treatment at 150° C.×500 hours) in the same manner as the examples 1 to 3. The results are shown in Table 2.

TABLE 2

|  | Example 1 | Example 2 | Example 3 | Comparative example 1 | Comparative example 2 | Comparative example 3 |
|---|---|---|---|---|---|---|
| Hardness | 70 | 60 | 80 | 90 | 90 | 85 |
| Initial light transmittance (%) | 88 | 87 | 88 | 88 | 88 | 90 |
| Following treatment at 150° C. × 500 hours | | | | | | |
| Light transmittance (%) | 87 | 87 | 87 | 72 | 70 | 65 |

Industrial Applicability

The heat-curable silicone composition of the present invention can be used favorably for the protection, bonding, or wavelength alteration or adjustment of a light emitting diode element, or as a lens material for a light emitting diode element.

What is claimed is:

1. A heat-curable silicone composition comprising:
   (A) an organopolysiloxane having at least one structure represented by the following general formula (2) within each molecule:

(2)

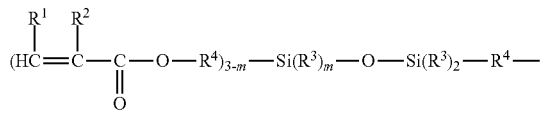

wherein m represents an integer of 0, 1 or 2, $R^1$ represents a hydrogen atom, a phenyl group or a halogenated phenyl group, $R^2$ represents a hydrogen atom or a methyl group, $R^3$ represents an identical or different monovalent organic group having 1 to 10 carbon atoms, and $R^4$ represents an identical or different bivalent organic group having 1 to 10 carbon atoms, and wherein the organopolysiloxane of component (A) comprises an average of 0.1-50 mol % of $SiO_2$ units relative to a combined total of all siloxane units in the organopolysiloxane of component (A); and (B) a quantity of an organic peroxide that is effective as a curing catalyst.

2. The composition according to claim 1, wherein a quantity of component (B) is within a range from 0.01 to 5 parts by mass per 100 parts by mass of the organopolysiloxane of component (A).

3. A light emitting diode element having a member comprising a cured product of the heat-curable silicone composition defined in claim 2.

4. A light emitting diode element having a member comprising a cured product of the heat-curable silicone composition defined in claim 1.

5. The composition according to claim 1, wherein $R^1$ represents a hydrogen atom.

6. The composition according to claim 1, wherein $R^1$ represents a phenyl group.

7. The composition according to claim 1, wherein $R^1$ represents a halogenated phenyl group.

8. The heat-curable silicone composition comprising:
   (A) an organopolysiloxane comprising the following MA unit, M unit and Q unit:

MA unit:

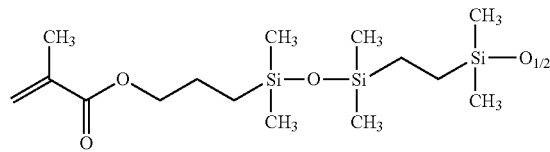

M unit:

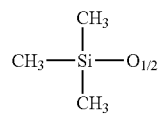

Q unit:

$SiO_{4/2}$ wherein the MA unit, the M unit and the Q unit are present in a molar ratio of MA:M:Q of 1:4:6; and (B) a quantity of an organic peroxide that is effective as a curing catalyst.

* * * * *